United States Patent [19]

Kuroda et al.

[11] Patent Number: 5,627,477

[45] Date of Patent: May 6, 1997

[54] SEMICONDUCTOR DEVICE AND BURN-IN METHOD THEREOF

[75] Inventors: Tadahiro Kuroda, Ichikawa; Makoto Noda, Yokohama, both of Japan

[73] Assignee: Kabushiki Kaisha Toshiba, Kawasaki, Japan

[21] Appl. No.: 651,769

[22] Filed: May 22, 1996

Related U.S. Application Data

[63] Continuation of Ser. No. 212,882, Mar. 15, 1994, abandoned.

[30] Foreign Application Priority Data

Mar. 15, 1993 [JP] Japan ................... 5-054044

[51] Int. Cl.⁶ .................................................. G01R 31/02
[52] U.S. Cl. ............................................ 324/760; 324/763
[58] Field of Search ......................... 307/350; 324/760, 324/763; 327/67, 74, 78, 77

[56] References Cited

U.S. PATENT DOCUMENTS 4,542,303  9/1985  Jarrett et al. ................... 307/350
5,155,386  10/1992  Abdi ................................ 327/67
5,227,865  7/1993  Moriizumi et al. ............ 307/350

FOREIGN PATENT DOCUMENTS 0369921  5/1990  European Pat. Off.

OTHER PUBLICATIONS

Research Disclosure, "Dynamic Burn-In of VLSI Products by Power Supply Cycling", No. 339, p. 527, Jul. 1992.
Patent Abstracts of Japan vol. 14, No. 144, Mar. 2, 1990.
Patent Abstracts of Japan vol. 18, No. 211, Apr. 14, 1994.

*Primary Examiner*—Kenneth A. Wieder
*Assistant Examiner*—Russell M. Kobert
*Attorney, Agent, or Firm*—Foley & Lardner

[57] ABSTRACT

The semiconductor device includes a circuit, such as, an ECL circuit for comparing input signals with a reference potential determined as a circuit threshold value and outputting an output signal according to the comparison result. The semiconductor device further includes a switching circuit for switching the reference potential level between ordinary operation and burn-in operation of the ECL circuit. The time required for the burn-in operation can be reduced markedly.

7 Claims, 14 Drawing Sheets

$$V_{ref} = \begin{cases} V_{IM} & (V_{IN} = GND) \\ V_{IN} - (I_B \cdot R + \phi) = V_{IN} + V_{IM} = \begin{cases} V_{ref(H)} \\ V_{ref(L)} \end{cases} \end{cases}$$

$$V_{ref} = \begin{cases} V_{IM} & (V_{IN} = GND) \\ V_{IN} - I_B \cdot R = V_{IN} + V_{IM} = \begin{cases} V_{ref(H)} \\ V_{ref(L)} \end{cases} \end{cases}$$

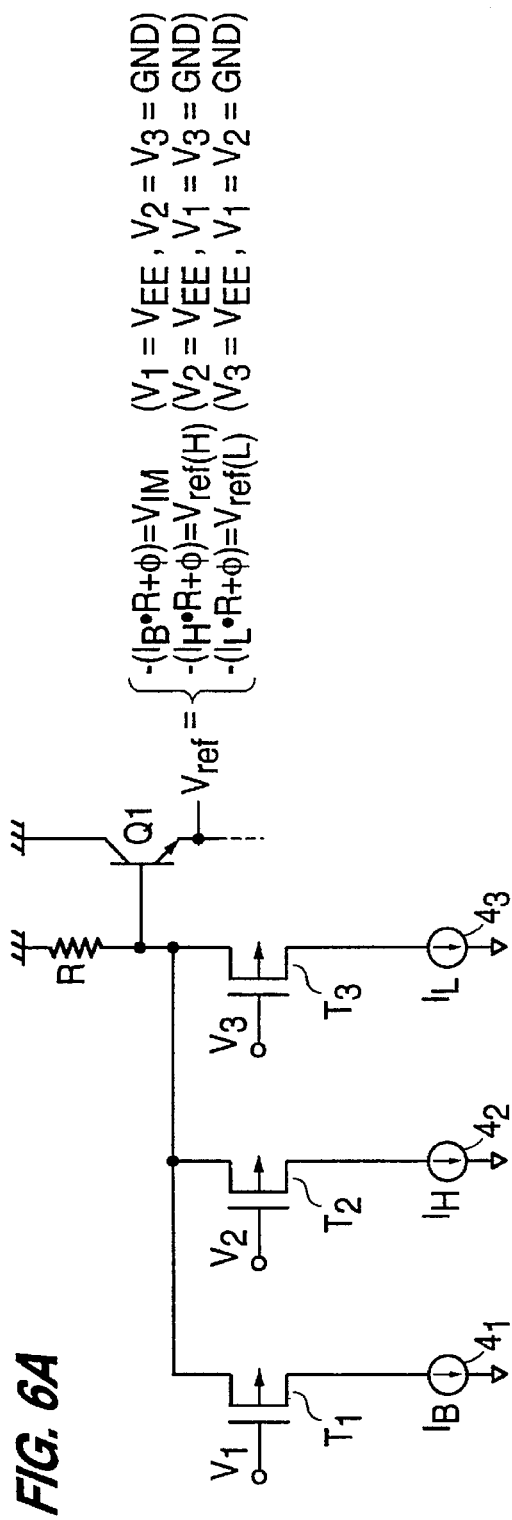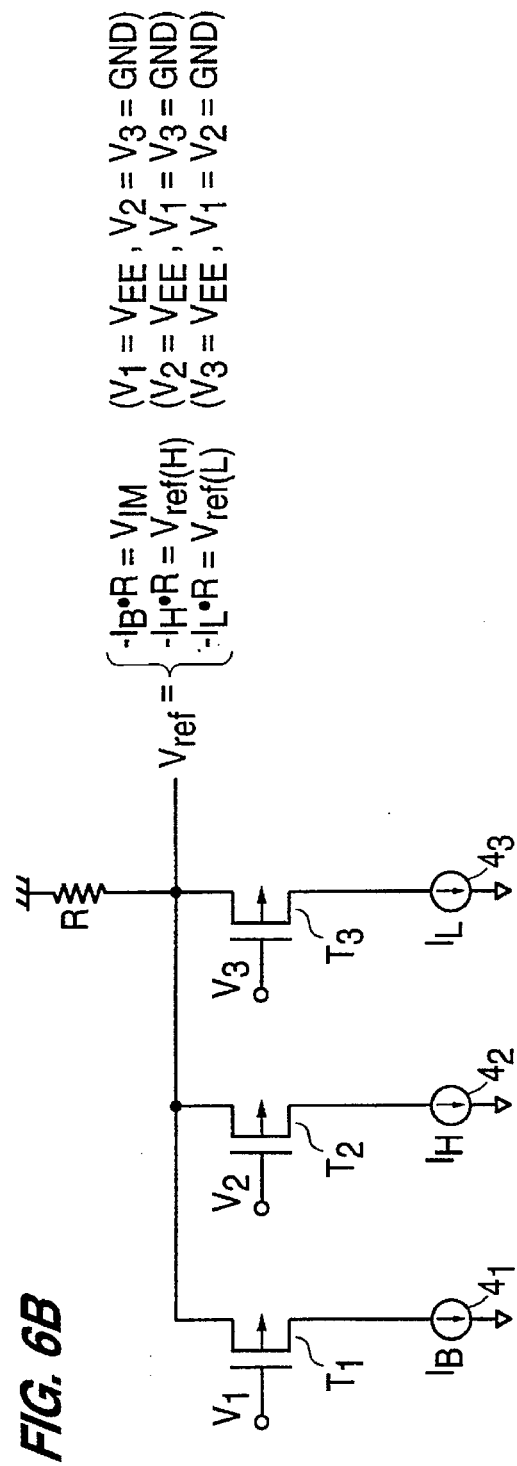

----- $V_{ref1(H)}$ (e.g., -0.5V)

——— $V_{IH1}$ (e.g., -0.8V)

——— $V_{IL1}$ (e.g., -1.4V)

----- $V_{ref1(L)}$ (e.g., -1.7V)

------ $V_{ref1(H)}$ (e.g., -0.5V)

——— $V_{IH1}$ (e.g., -0.8V)

(e.g., -1.3V) $V_{ref2(H)}$ ------

——— $V_{IL1}$ (e.g., -1.4V)

(e.g., -1.6V) $V_{IH2}$ ———

------ $V_{ref1(L)}$ (e.g., -1.7V)

(e.g., -2.2V) $V_{IL2}$ ———

(e.g., -2.5V) $V_{ref2(L)}$ ------

FIG. 12
////////// $V_{CC}$ (0V)
(e.g., -0.8V) $V_{ref1}(H)$ ------ $V_{IH1}$ (e.g., -0.8V)
——— $V_{IM1}$ (e.g., -1.1V)
(e.g., -1.4V) $V_{ref1}(L)$ ------ $V_{IL1}$ (e.g., -1.4V)
FIG. 13
////////// $V_{CC}$ (0V)
(e.g., -0.8V) $V_{ref1}(H)$ ------ $V_{IH1}$ (e.g., -0.8V)
——— $V_{IM1}$ (e.g., -1.1V)
(e.g., -1.4V) $V_{ref1}(L)$ ------ $V_{IL1}$ (e.g., -1.4V)
——— $V_{IH2}$ (e.g., -1.6V)
(e.g., -1.6V) $V_{ref2}(H)$ ------ 
——— $V_{IM2}$ (e.g., -1.9V)
(e.g., -2.2V) $V_{ref2}(L)$ ------ $V_{IL2}$ (e.g., -2.2V)
FIG. 14A
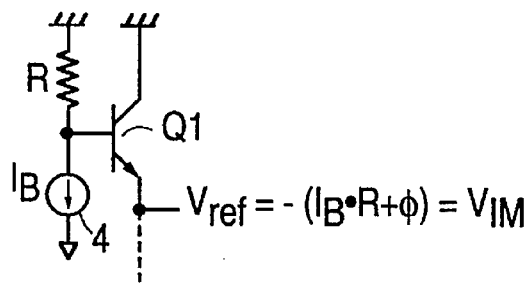
$V_{ref} = -(I_B \cdot R + \phi) = V_{IM}$
FIG. 14B
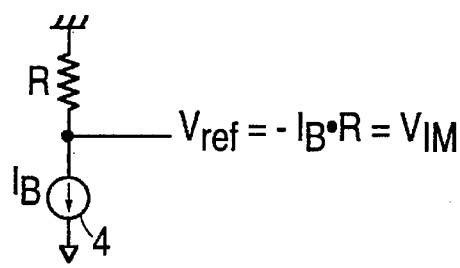
$V_{ref} = -I_B \cdot R = V_{IM}$

FIG. 16
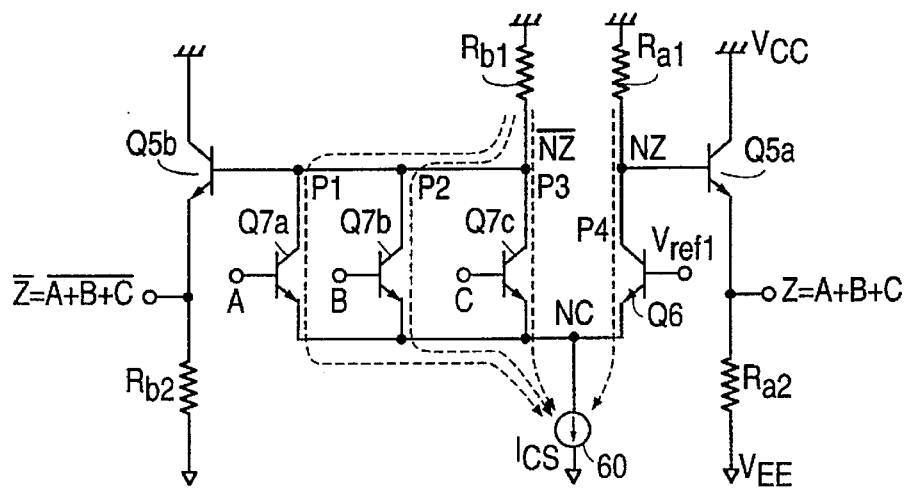
FIG. 17
////////// $V_{CC}$ (0V)
——— $V_{IH1}$ (e.g., −0.8V)
– – – $V_{ref1} = V_{IM1} = \dfrac{V_{IM1} + V_{IL1}}{2}$ (e.g., −1.1V)
——— $V_{IL1}$ (e.g., −1.4V)
FIG. 18
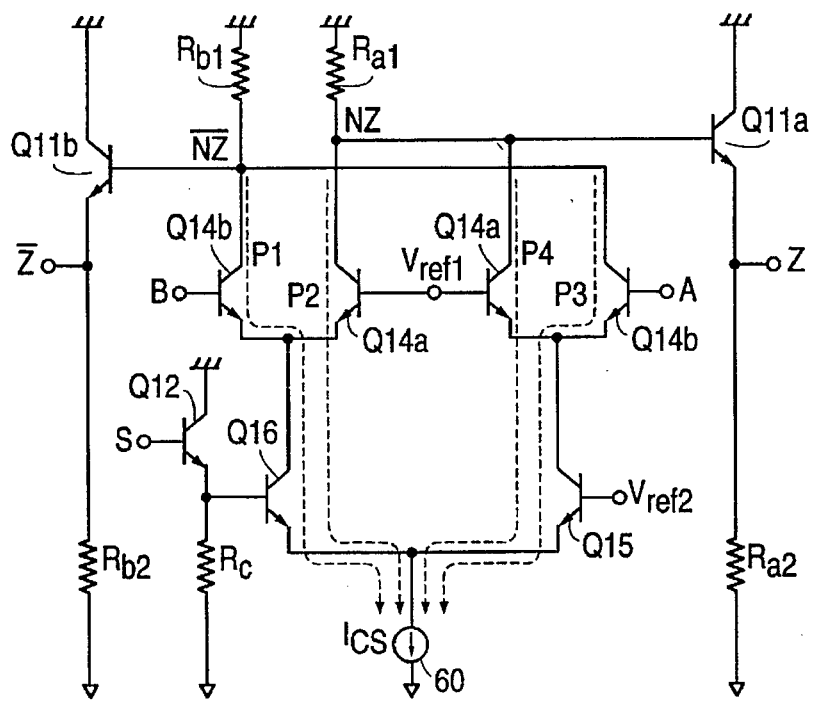

////////// $V_{CC}$ (0V)

——— $V_{IH1}$ (e.g., -0.8V)

- - - - $V_{ref1} = V_{IM1} = \dfrac{V_{IH1} + V_{IL1}}{2}$ (e.g., -1.1V)

——— $V_{IL1}$ (e.g., -1.4V)

——— $V_{IH2}$ (e.g., -1.6V)

- - - - $V_{ref2} = V_{IM2} = \dfrac{V_{IH2} + V_{IL2}}{2}$ (e.g., -1.9V)

——— $V_{IL2}$ (e.g., -2.2V)

$V_{IH2} = V_{IH1} - \phi$
$V_{IL2} = V_{IL1} - \phi$ $\phi$ : $V_{BE}$ OF BIPOLAR TR (ABOUT 0.8V)

SEMICONDUCTOR DEVICE AND BURN-IN METHOD THEREOF

This application is a continuation of application Ser. No. 08/212,882, filed Mar. 15, 1994, now abandoned.

BACKGROUND OF THE INVENTION

1. Field of the Invention

The present invention relates to a semiconductor device such as an ECL (emmiter coupled logic) circuit and a burn-in method thereof. Here, the burn-in implies an activation of a circuit prior to an actual operation in order to stabilize the circuit characteristics and to find a defective circuit at the initial stage thereof.

2. Description of the Prior Art

The circuit configuration and function of the ECL circuit will be described first, that is an example for which a conventional burn-in method has been applied and the burn-in method of the present invention will be applied.

FIG. 16 shows an example of the ECL circuit. In this ECL circuit provided with an OR/NOR gate for three inputs A, B and C, when any one of the three inputs A, B and C becomes high beyond a reference potential $V_{ref1}$ (determined as a circuit threshold value), only one transistor (whose input is high) of three transistors $Q7_a$, $Q7_b$ and $Q7_c$ is turned on and the remaining other transistors and a transistor Q6 are all turned off, so that a current $I_{CS}$ of a constant current source 60 flows through only one current path (the turned-on transistor) of three current paths P1, P2 and P3. Therefore, a potential at a node N2 becomes higher than that at a node /NZ, so that an output Z of the ECL circuit changes to an "H" (High) level by an emitter follower output stage composed of a transistor $Q5_a$ and a resistor $R_{a2}$, and another output /Z of the ECL circuit changes to an "L" (Low) level by another emitter follower output stage composed of a transistor $Q5_b$ and a resistor $R_{b2}$.

On the other hand, when all the three inputs A, B and C are low below the reference potential $V_{ref1}$, the transistors $Q7_a$, $Q7_b$ and $Q7_c$ are turned off and the transistor Q6 is turned on, so that the current $I_{CS}$ of the constant current source 60 flows through the current path P4. Therefore, a potential at the node NZ becomes lower than that at the node /NZ, so that the output Z of the ECL circuit changes to the "L" level by the above-mentioned emitter follower output stage, and the other output /Z of the ECL circuit changes to the "H" level by the other emitter follower output stage. As described above, a logical sum (=A+B+C) of three inputs A, B and C can be outputted from the output Z of the ECL circuit, and a NOT logical sum (=/(A+B+C)) of three inputs A, B and C a can be outputted from the output /Z of the ECL circuit. Further, in the above-mentioned ECL circuit, the reference potential $V_{ref1}$ is set to an intermediate level (e.g., $V_{IM1}=(V_{IH1}+V_{IL1})/2$) between the "H" level (e.g., $V_{IH1}=-0.8$ V) of the input signals A, B and C and the "L" level (e.g., $V_{IL1}=-1.4$ V) thereof, as shown in FIG. 17.

Further, FIG. 18 shows another example of the ECL circuit. This ECL circuit is a two-input multiplexer for passing any one of two inputs A and B through an output Z on the basis of a select signal S. This ECL circuit requires two reference potentials $V_{ref1}$ and $V_{ref2}$. FIG. 19 shows the relationship among the two reference potentials $V_{ref1}$ and $V_{ref2}$ and two "H" levels ($V_{IH1}$, $V_{IH2}$) and two "L" levels ($V_{IL1}$, $V_{IL2}$) of two input signals A and B. In more detail, the reference potential $V_{ref1}$ is an intermediate level between $V_{IH1}$ and $V_{IL1}$ and the reference potential $V_{ref2}$ is an intermediate level between $V_{IH2}$ and $V_{IL2}$, respectively. Here, $V_{IH2}=V_{IH1}-\Phi$ and $V_{IL2}=V_{IL1}-\Phi$, respectively, where $-\Phi$ a $V_{BE}$ of a base-emitter voltage is equal to bipolar transistor (0.8 V, in general).

FIG. 20 shows a bathtub-like curve which represents the change in failure rate of the ECL circuit with the lapse of time. In this bathtub-like characteristic curve, the failure rate can be classified into three periods of initial failure period, accidental failure period and wear-out failure period with the lapse of time. In the initial failure period, the failure due to a design miss or process defects existing in the circuit potentially is actualized at the start of use of the circuit. In the accidental failure period, various failures of the composing elements (which are not actualized in the initial failure period) are actualized in combination at roughly a constant failure rate. In the wear-out failure period, the failure rate due to aged composing elements rises with the lapse of time.

In order to reduce the defective product rate below a constant specified level after the products have been shipped, it is necessary for the maker to stabilize the failure rate at a low level. This process is referred to as a burn-in process. In the base of the burn-in process of the integrated circuit in general, non-defective chips classified according to functions are sealed into packages, and further activated by inputting various test patterns which can realize various actual circuit operation as much as possible so that the failure factors related to the initial defectiveness can be actualized. In the cases of the ECL circuits as shown in FIGS. 16 and 18, for instance, the input signals (test patterns) are switched so that current can be passed through the respective current paths P1, P2, P3 and P4, respectively, in order that the defectiveness factors potentially existing in the respective current paths can be actualized.

A conventional burn-in method will be described herein below with reference to FIG. 16. The four test patterns shown in Table 1 will be applied to the input terminals A, B and C for the burn-in process to make currents pass through the respective current paths P1, P2, P3 and P4 of the OR gate for three inputs of the ECL circuit shown in FIG. 16.

TABLE 1

| POTENTIAL OF TERMINAL | | | |
|---|---|---|---|
| A | B | C | CURRENT PATH |
| H | L | L | P1 |
| L | H | L | P2 |
| L | L | H | P3 |
| L | L | L | P4 |

However, in the case of the integrated circuit (IC) device in which a plurality of ECL circuits are connected to each other, extensive and bulky test patterns must be inputted to the device via a large number of input terminals to make currents pass through all of the circuit elements of the device.

For example, in the case of the circuit shown in FIG. 21 which is composed by connecting two of the OR gates of FIG. 16 in series, six test patterns as shown in TABLE 2 must be inputted to the input terminals A1, B1 and C1 of the first OR gate OR1 and the terminals B2 and C2 of the second OR gate for burn-in process.

TABLE 2

| POTENTIAL OF TERMINAL | | | | | CURRENT PATH | |
|---|---|---|---|---|---|---|
| A1 | B1 | C1 | B2 | C2 | OR1 | OR2 |
| H | L | L | L | L | P1 | P1 |
| L | H | L | L | L | P2 | P1 |
| L | L | H | L | L | P3 | P1 |
| L | L | L | H | L | P4 | P2 |
| L | L | L | L | H | P4 | P3 |
| L | L | L | L | L | P4 | P4 |

A recent general-scale integrated circuit (LSI) device in general is provided with hundreds of input terminals. The number of test patterns for the burn-in process to the LSI device is in the range of thousands and ten thousands steps and the time required for the process per chip of the LSI device is in the range of several hours and tens of hours.

Since hundreds of chips are generally arranged on a wafer, when it takes one hour for the burn-in process per chip, it will take about a thousand hours (about 42 days) per wafer and this is unpractical.

For that reason, conventionally, after each chip is sealed into a package, a large number of packages are mounted on a burn-in board and simultaneously brought into under the burn-in process.

In the conventional burn-in method described above, however, there exist the following problems:

(1) As described above, after each chip is sealed into a package, the burn-in process is performed because it takes time to perform the process to a wafer. Since the sealing of the chips into packages is relative costly, when the chips are determined to be defective in the burn-in process, the package cost becomes wasteful. This will be the cause of a big problem because ECL circuits are mostly sealed into expensive packages for aiming at high performance.

(2) Various burn-in boards must be prepared according to each product or each package.

(3) Since various test patterns must be inputted to a large number of input terminals, relatively expensive pulse generators are required in the burn-in process.

(4) Extensive and bulky test patterns must be inputted into all of circuits elements of a chip in order to pass current there through and to check the defective factors. Relatively longer hours are thus required for the burn-in process.

The above-mentioned problems have become serious more and more with the recent advance of the diversification of the chip (package), the increasing number of the pins, the decreasing delivery lead time, etc.

SUMMARY OF THE INVENTION

With these problems in mind, therefore, it is the object of the present invention to provide a semiconductor device and a burn-in method thereof, which can shorten the time required for the burn-in process of the ECL circuits as much as possible.

To achieve the above-mentioned object, a first aspect of the present invention provides a burn-in method for a semiconductor device which compares an input signal potential with a reference potential to output an output signal according to the comparison result.

The method comprises the step of setting the reference potential to a level higher than a maximum level or lower than a minimum level of the input signal potential.

Further, a second aspect of the present invention provides a burn-in method for a semiconductor device which compares an input signal potential with a reference potential to output an output signal according to the comparison result.

The method comprises the step of setting the input signal potential to an intermediate level between a maximum level and a minimum level of the input signal potential; and setting the reference potential to a level higher than or lower than the input signal potential determined as the intermediate level.

Further, a third aspect of the present invention provides a semiconductor device which compares an input signal potential with a reference potential to output an output signal according to the comparison result in ordinary operation.

The semiconductor device comprises switching means for switching the reference potential level between the ordinary operation and burn-in operation.

In the semiconductor device, the switching means sets the reference potential to a level higher than a maximum level or lower than a minimum level of the input signal potential.

The semiconductor device further comprises setting means for setting the input signal potential to an intermediate level between a maximum level and a minimum level of the input signal potential and the switching means sets the reference potential to a level higher than or lower than the input signal potential determined as the intermediate level.

The semiconductor device further comprises a plurality of signal output circuits connected together, each of which has a differential circuit, the signal output circuit comparing an input signal potential applied to the differential circuit with a reference potential to output an output signal according to the comparison results and the setting means sets an input signal potential, to be applied to a post-stage signal output circuit, to the intermediate level by shorting complementary output nodes of the differential circuit.

According to the first aspect (the burn-in method) of the present invention, the reference potential is set to a level higher than or lower than a level of an input signal potential to be applied to a semiconductor device. It is thus possible to employ the reference potential which is higher or lower than the input signal potential as a test pattern for the burn-in operation.

According to the second aspect (the burn-in method) of the present invention, the input signal potential is set to its intermediate level and the reference potential to a level higher or lower than the intermediate level. It is also possible to employ the reference potential which is higher or lower than the input signal potential as a test pattern for the burn-in operation.

According to the third aspect (the semiconductor device) of the present invention, the reference potential level is switched between the ordinary operation and the burn-in operation. It is possible to switch the current paths of the semiconductor device, so that it is possible to shorten the time required for the burn-in operation.

According to the semiconductor device, the input signal potential is set to its intermediate level and the reference potential to a level higher or lower than the intermediate level. It is also possible to switch the current paths of the semiconductor device, so that it is possible to shorten the time required for the burn-in operation.

According to the semiconductor device comprising a plurality of signal output circuits connected together, by shorting complementary output nodes of the differential circuit of a pre-stage signal output circuit, its output signal potential, that is an input signal of a post-stage signal output circuit, is set to its intermediate level and the reference potential level is further set to a level higher or lower than the intermediate level, so that the reference potential is switched between the ordinary operation and the burn-in operation. It is thus possible to switch the current paths of signal output circuits connected together, so that it is possible to shorten the time required for the burn-in operation.

BRIEF DESCRIPTION OF THE DRAWINGS

FIGS. 6A and 6B are circuit diagrams showing a modification of the second embodiment of the third aspect of the present invention;

FIG. 10 is an illustrating for assistance in explaining the reference potential levels of a first embodiment of a first aspect of the burn-in method according to the present invention;

FIG. 11 is an illustration for assistance in explaining the reference potential levels of a second embodiment of the first aspect of the burn-in method according to the present invention;

FIG. 12 is an illustration for assistance in explaining the reference potential levels of a first embodiment of a second aspect of the burn-in method according to the present invention;

FIG. 13 is an illustrating for assistance in explaining the reference potential levels of a second embodiment of the second aspect of the burn-in method according to the present invention;

FIGS. 14A and 14B are circuit diagrams for assistance in explaining the concept of the reference potential generating circuit;

FIG. 16 is a circuit diagram showing an example of the ECL circuit;

FIG. 17 is an illustration for assistance in explaining the reference potential level of the ECL circuit shown in FIG. 16;

FIG. 18 is a circuit diagram showing another example of the ECL circuit;

DETAILED DESCRIPTION OF THE PREFERRED EMBODIMENTS

Figure 1A:
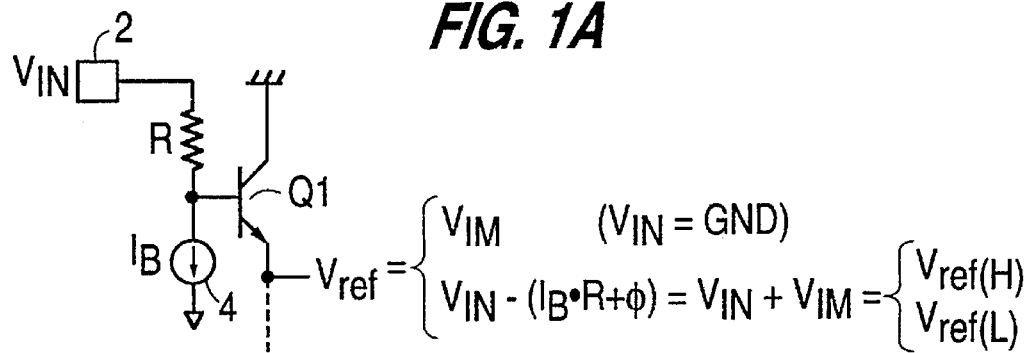
FIGS. 1A and 1B are circuit diagrams for assistance in explaining a concept of a first embodiment of a third aspect of the present invention.

A first embodiment of a first aspect of the present invention will be described hereinbelow with reference to FIGS. 10 and 16. The burn-in method of this embodiment is adopted for the ECL circuit as shown in FIG. 16, in which there is only one reference potential $V_{refl}$ (determined as a threshold value of the circuit) used in the circuit. That is, in the burn-in process, the reference potential $V_{refl}$ is determined to be higher than an "H" level $V_{IH1}$ or lower than an "L" level $V_{IL1}$ of the three input signals A, B and C, in order to switch simultaneously the current paths of the respective gates of the ECL circuit. For instance, the "H" level $V_{refl}$ (H) and the "L" level $V_{refl}$ (L) of the reference potential $V_{refl}$ are determined so as to satisfy the following conditions: $V_{refl}$ (H)>$V_{IH1}$, and $V_{refl}$ (L)<$V_{IL1}$, as shown in FIG. 10. Further, in the ordinary operation other than the burn-in operation, as shown in FIG. 17, the reference potential $V_{refl}$ is determined at an intermediate level $V_{IM1}$ between the "H" level $V_{IH1}$ and the "L" level $V_{IL1}$ of the three input signals A, B and C.

When the reference potential $V_{refl}$ is set to the "H" level $V_{refl}$ (H) in the burn-in operation, since the potential levels of the three input signals A, B and C of the ECL circuit shown in FIG. 16 are lower than $V_{refl}$, the current $I_{CS}$ of the constant current source 60 flows through the path P4. Further, when the reference potential $V_{refl}$ is set to the "L" level $V_{refl}$ (L) in the burn-in operation, the current $I_{CS}$ of the constant current source 60 flows through only the path of the transistor to which the input signal of "H" level $V_{IH1}$ (H) is applied among the three input signals A, B and C. For instance, if the input signals A and B are at the $V_{IH1}$ and the input signal C is at the $V_{IL1}$, current flows through two paths P1 and P2. Under these conditions, in the ECL circuit shown in FIG. 16, since the potential at the node NC is at $V_{IH1}-\Phi$ where $\Phi$ denotes $V_{BE}$ (about 0.8 V in general) of a bipolar transistor 0.8 V), the base-emitter voltage $V_{BE}$ of the transistor $Q_{7C}$ to which the input signal C is applied is as $$V_{BE}=V_{IL1}-(V_{IH1}-\Phi)=\Phi-(V_{IH1}-V_{IL1})<\Phi$$

so that the transistor $Q7_C$ is turned off and no current flows through the path P3.

As described above, when the reference potential $V_{refl}$ is set to the "H" level $V_{refl}$ (H) or the "L" level $V_{refl}$ (L), the current paths of the ECL circuit shown in FIG. 16 can be switched as listed in Table 3 below:

TABLE 3

| POTENTIAL OF $V_{ref1}$ | CURRENT PATH |
| --- | --- |
| $V_{ref1}$ (L) | ANY OF P1, P2 and P3 |
| $V_{ref1}$ (H) | P4 |

As described above, in the burn-in operation of the present embodiment, it is possible to switch the current paths by only setting the level of the reference potential $V_{ref1}$ to the "H" level $V_{ref1}$ (H) or the "L" level $V_{ref1}$ (L), so that the time required for the burn-in operation can be reduced markedly, as compared with the conventional burn-in operation (Table 1).

Further, the burn-in operation of the first embodiment can be applied to an IC device in which are large number of ECL circuits of FIG. 16 are connected together. In this case, since a reference potential $V_{ref}$ is shared by all of the ECL circuits of the IC device, it is possible to simultaneously switch current paths of all of the ECL circuits, so that the time required for the burn-in operation can be reduced markedly.

Figures 19, 20:
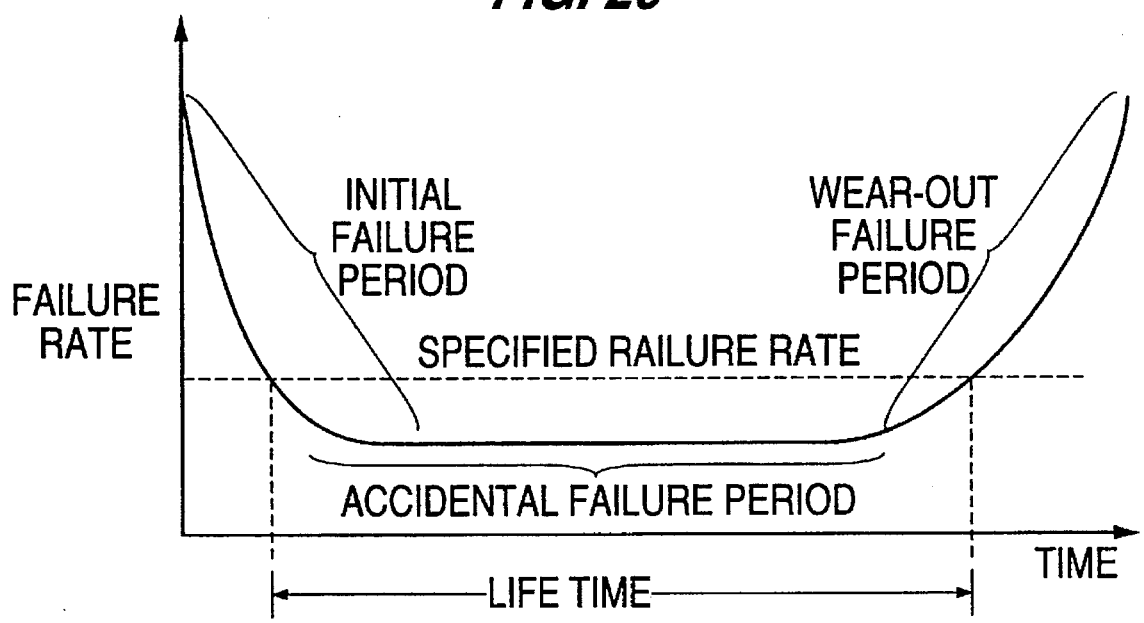
FIG. 19 is an illustration for assistance in explaining the reference potential levels of the ECL circuit shown in FIG. 18.
FIG. 20 is a graphical representation showing the change in failure rate of the ECL circuit with the lapse of time.
Figure 21:
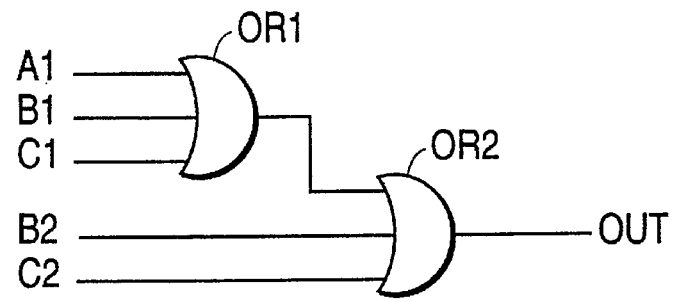
FIG. 21 is a circuit diagram showing a practical example of a circuit in which two OR gates for three inputs according to the ECL circuit shown in FIG. 16.
Figure 22:
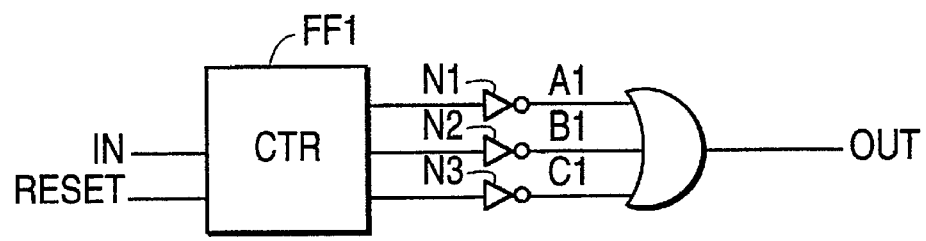
FIG. 22 is a circuit diagram showing a practical example of a circuit in which a counter and inverters are provided in front of the circuit shown in FIG. 21.
Figure 23:
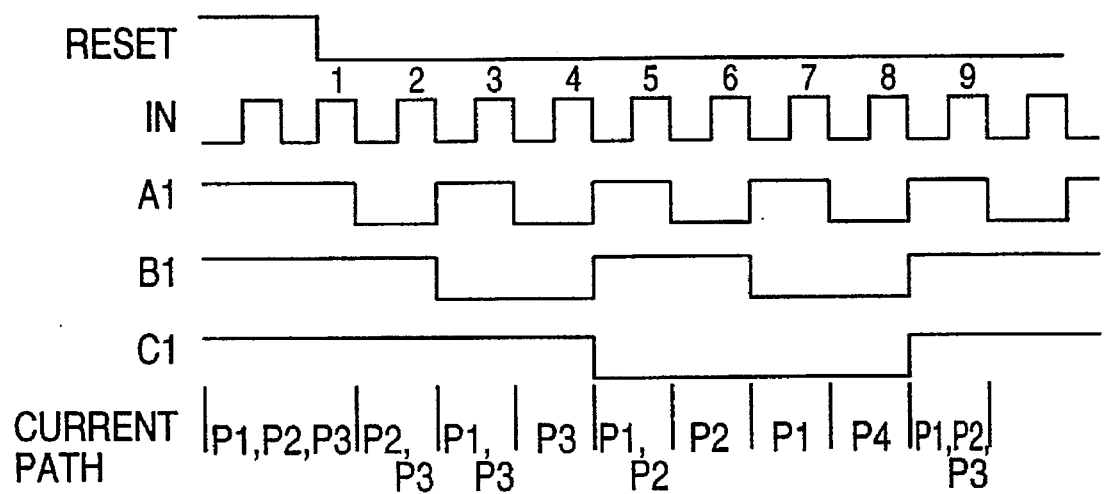
FIG. 23 is a timing chart for assistance in explaining the function of the circuit shown in FIG. 22.

A second embodiment of the first aspect of the present invention will be described hereinbelow with reference to FIGS. 11 and 18. The burn-in method of this embodiment is adopted for the ECL circuit as shown in FIG. 18, in which the number of the reference potentials used in the circuit are two. That is, in the burn-in process, the reference potentials $V_{ref1}$ and $V_{ref2}$ are determined to be higher than the "H" level $V_{IH1}$ and $V_{IH2}$ or lower than the "L" level $V_{IL1}$ and $V_{IL2}$ of the two input signals A and B, in order to switch simultaneously the current paths of the respective gates of the ECL circuit, irrespective of the levels of the input signals A and B. For instance, the "H" levels $V_{ref1}$ (H) and $V_{ref2}$ (H) and the "L" levels $V_{ref1}$ (L) and $V_{ref2}$ (L) of the reference potentials $V_{ref1}$ and $V_{ref2}$ are determined so as to satisfy the following conditions: $V_{ref1}$ (H)>$V_{IH1}$; $V_{ref1}$ (L)<$V_{IL1}$; and $V_{ref2}$ (H)>$V_{IH2}$; $V_{ref2}$ (L)<$V_{IL2}$ as shown in FIG. 11. Further, in the ordinary operation other than the burn-in operation, as shown in FIG. 19, the reference potentials $V_{ref1}$ and $V_{ref2}$ are determined at an intermediate level $V_{IM1}$ between the "H" level $V_{IH1}$ and the "L" level $V_{IL1}$ and another intermediate level $V_{IM2}$ between the "H" level $V_{IH2}$ and the "L" level $V_{IL2}$, respectively.

When the reference potentials $V_{ref1}$ and $V_{ref2}$ are set to the "H" levels $V_{ref1}$ (H) and $V_{ref2}$ (H) or the "L" levels $V_{ref1}$ (L) and $V_{ref2}$ (L) in the burn-in operation, the current paths of the ECL circuit shown in FIG. 18 can be switched as listed in Table 4 below:

TABLE 4

| POTENTIAL OF $V_{ref2}$ | POTENTIAL OF $V_{ref1}$ | CURRENT PATH |
| --- | --- | --- |
| $V_{ref2}$ (L) | $V_{ref1}$ (L) | P1 |
| $V_{ref2}$ (L) | $V_{ref1}$ (H) | P2 |
| $V_{ref2}$ (H) | $V_{ref1}$ (L) | P3 |
| $V_{ref2}$ (H) | $V_{ref1}$ (H) | P4 |

As described above, in the burn-in method of the second embodiment, it is possible to switch the current paths by only setting the levels of the reference potentials $V_{ref1}$ and $V_{ref2}$ to the "H" levels $V_{ref1}$ (H) and $V_{ref2}$ (H) or the "L" levels $V_{ref1}$ (L) and $V_{ref2}$ (L), so that the time required for the burn-in operation can be reduced markedly.

Further, the same as the first embodiment, the burn-in operation of the second embodiment can be applied to an IC device in which a large number of ECL circuits of FIG. 16 are connected together. In this case, since reference potentials $V_{ref}$ are shared by all of the ECL circuits of the IC device, it is possible to simultaneously switch current paths of all of the ECL circuits, so that the time required for the burn-in operation can be reduced markedly.

Further, in the above-mentioned first embodiment, all the paths cannot be switched freely. For instance, one of the paths (connected to the input transistors Q7$_a$, Q7$_b$ and Q7$_c$) through which current flows is determined by the input signals A, B and C. Therefore, the test patterns for inputting the signals are still required in order to pass current through all the paths.

In addition, the above-mentioned second embodiment is restricted as follows: there exists the case where it is impossible to obtain $V_{ref1}$=$V_{ref1}$ (L) and $V_{ref2}$=$V_{ref2}$ (H). For instance, in the case where $V_{ref1}$ (L)=−1.7 V and $V_{ref2}$ (H)=−1.3 V in FIG. 18, the potential at the node N1 is $V_{ref1}$ (L)−Φ=−1.7 V−0.8 V=−2.5 V. Therefore, since the collector potential of the bipolar transistor Q15 to which $V_{ref2}$ is inputted is −2.5 V and the base potential thereof is $V_{ref2}$ (H) =−1.3 V, $V_{BC}$=−1.3 V−(−2.5 V)=1.2 V>Φ, so that the direction in potential difference between the base and collector of the transistor Q15 is set to the forward direction (turn-on direction). As a result, current flows from the base to the collector and further through the substrate as a substrate current, thus causing a problem in that the transistor is latched up. In order to prevent the direction in potential difference between the base and the collector of the transistor Q15 from being set to the forward direction, the following conditions are necessary: $V_{BE}$=$V_{ref2}$ (H)−($V_{ref1}$ (L)−Φ)<Φ; that is, $V_{ref1}$ (L)>$V_{ref2}$ (H). In order to satisfy the conditions that $V_{ref1}$ (L)>$V_{IH1}$ and $V_{ref2}$ (H)>$V_{IH2}$ including the noise margin under the above-mentioned restriction, the necessary conditions are to set the logical amplitudes $V_{IH1}$−$V_{IL1}$, and $V_{IH2}$−$V_{IL2}$ of the gate of the ECL circuit to be fairly small values, as compared with Φ. If not so, it is impossible to obtain the setting of $V_{ref1}$=$V_{ref1}$ (L) and $V_{ref2}$=$V_{ref2}$ (H) in Table 2, so that current cannot be passed through the path P3.

A first embodiment of a second aspect of the burn-in method according to the present invention will be described hereinbelow with reference to FIGS. 12 and 16. The burn-in method of this embodiment is applied to the case in which a plurality of the ECL circuits as shown in FIG. 16 are connected together. In the burn-in process, the complementary outputs (e.g., the nodes NZ and /NZ) of the differential switch stage of all the ECL circuits are shorted, and further the reference potential $V_{ref1}$ is set to the "H" level $V_{ref1}$ (H) or the "L" level $V_{ref1}$ (L). Here, the level values $V_{ref1}$ (H) and $V_{ref1}$ (L) must satisfy the following conditions as shown in FIG. 12:

$$V_{ref1}(H) > V_{IM1} > V_{ref1}(L)$$

where $V_{IM1}$ is an intermediate level between the "H" level $V_{IH1}$ and the "L" level $V_{IL1}$. Further, in the ordinary operation, the reference potential $V_{ref1}$ is set to an intermediate level $V_{IM1}$ between the "H" level $V_{IH1}$ and the "L" level $V_{IL1}$ of the input signal, as shown in FIG. 17.

When the complementary outputs of the differential switch stage of all the ECL circuits are shorted, the output potentials of all the ECL circuits are set to an intermediate level $V_{IM1}$ between the "H" level $V_{IH1}$ and the "L" level $V_{IL1}$, so that the potentials of the inputs A, B and C of all the gates are set to an intermediate level $V_{IM1}$ between the "H" level $V_{IH1}$ and the "L" level $V_{IL1}$, respectively. Here, if the reference potential $V_{ref1}$ is set to the "H" level $V_{ref1}$ (H), since all the potentials of the three input signals A, B and C

9 as shown in FIG. 16 are lower than the reference potential $V_{ref1}$ due to the fact that output signals of a pre-stage ECL circuit are inputted as the input signals A, B and C, current flows through the path P4. On the other hand, if the reference potential $V_{ref1}$ is set to the "L" level $V_{ref1}$ (L), since all the potentials $V_{IM1}$ of the three input signals, A, B and C are higher than the reference potential $V_{ref1}$ and further equal to each other, current flows through the paths P1, P2 and P3 uniformly.

As described above, after the complementary output nodes NZ and /NZ of the differential switch stage of all the ECL circuits have been shorted, it is possible to switch the current paths of the gates of the ECL circuit as shown in FIG. 16 by setting the reference potential $V_{ref1}$ to the "H" level $V_{ref1}$ (H) or the "L" level $V_{ref1}$ (L), as listed in Table 5 below.

TABLE 5

| POTENTIAL OF $V_{ref1}$ | CURRENT PATH |
| --- | --- |
| $V_{ref1}$ (L) | P1, P2, P3 (UNIFORM) |
| $V_{ref1}$ (H) | P4 |

As described above, it is possible to reduce the time required for the burn-in operation markedly according to the present embodiment. In addition, since not test pattern like in the conventional method is required, the burn-in operation can be effected to some extent on the wafer, with the result that is possible to eliminate the expensive process of packaging the chips and the use of expensive pulse generators for inputting the test patterns.

A second embodiment of the second aspect of the burn-in method according to the present invention will be described hereinbelow with reference to FIGS. 13 and 18. The burn-in method of this embodiment is applied to the case in which a plurality of the ECL circuits as shown in FIG. 18 are connected together. In the burn-in process, the complementary outputs (e.g., the nodes NZ and /NZ) of the differential switch stage of all the ECL circuits are shorted, and further the reference potentials $V_{ref1}$ and $V_{ref2}$ are set to the "H" levels $V_{ref1}$ (H) and $V_{ref2}$ (H) or the "L" levels $V_{ref1}$ (L) and $V_{ref2}$ (L), respectively. Here, the level values $V_{ref1}$ (H) and $V_{ref1}$ (L) and $V_{ref2}$ (H) and $V_{ref2}$ (L) must satisfy the following conditions as shown in FIG. 13:

$$V_{ref1}(H) > V_{IM1} > V_{ref1}(L)$$

and $$V_{ref2}(H) > V_{IM2} > V_{ref2}(L)$$

where $V_{IM1}$ and $V_{IM2}$ are an intermediate level between the "H" level $V_{IH1}$ and the "L" level $V_{IL1}$ and another intermediate level between the "H" levels $V_{IH2}$ and the "L" level $V_{IL2}$, respectively. Further, in the ordinary operation, the reference potentials $V_{ref1}$ and $V_{ref2}$ are set to the intermediate levels $V_{IM1}$ and $V_{IM2}$, respectively, as shown in FIG. 19.

After the complementary output nodes NZ and /NZ of the differential switch stage of all the ECL circuits have been shorted. It is possible to switch the current paths of the gates of the ECL circuit as shown in FIG. 18 by setting the reference potential $V_{ref1}$ to the "H" level $V_{ref1}$ (H) or the "L" level $V_{ref1}$ (L) and the reference potential $V_{ref2}$ to the "H" level $V_{ref2}$ (H) or the "L" level $V_{ref2}$ (L) respectively, as listed in Table 6 below.

10

TABLE 6

| POTENTIAL OF $V_{ref2}$ | POTENTIAL OF $V_{ref1}$ | CURRENT PATH |
| --- | --- | --- |
| $V_{ref2}$ (L) | $V_{ref1}$ (L) | P1 |
| $V_{ref2}$ (L) | $V_{ref1}$ (H) | P2 |
| $V_{ref2}$ (H) | $V_{ref1}$ (L) | P3 |
| $V_{ref2}$ (H) | $V_{ref1}$ (H) | P4 |

As described above, in this second embodiment, it is possible to obtain the same effect as with the case of the first embodiment.

A third aspect of the semiconductor device including a circuit, such as an ECL circuit, and a reference potential control circuit which conducts the burn-in operation will be described. Prior to the description of the semiconductor device, a reference potential generating circuit for generating a reference potential of the ECL circuit will be first described hereinbelow. The reference potential generating circuit is configured in general, as shown in FIGS. 14A and 14B, respectively. The reference potential generating circuit shown in FIG. 14A includes a load resistor R grounded at one end thereof, a current source 4 connected to the other end of the load resistor R, and an npn type bipolar transistor Q1 having a base connected to the other end of the resistor R and a collector grounded. A reference potential $V_{ref}$ is generated from an emitter of the transistor Q1. In the case of the reference potential generating circuit shown in FIG. 14B, the transistor Q1 of the reference potential generating circuit shown in FIG. 14A is omitted and the reference potential $V_{ref}$ is taken out of a junction point between the load resistor R and the current source 4.

Figure 15:
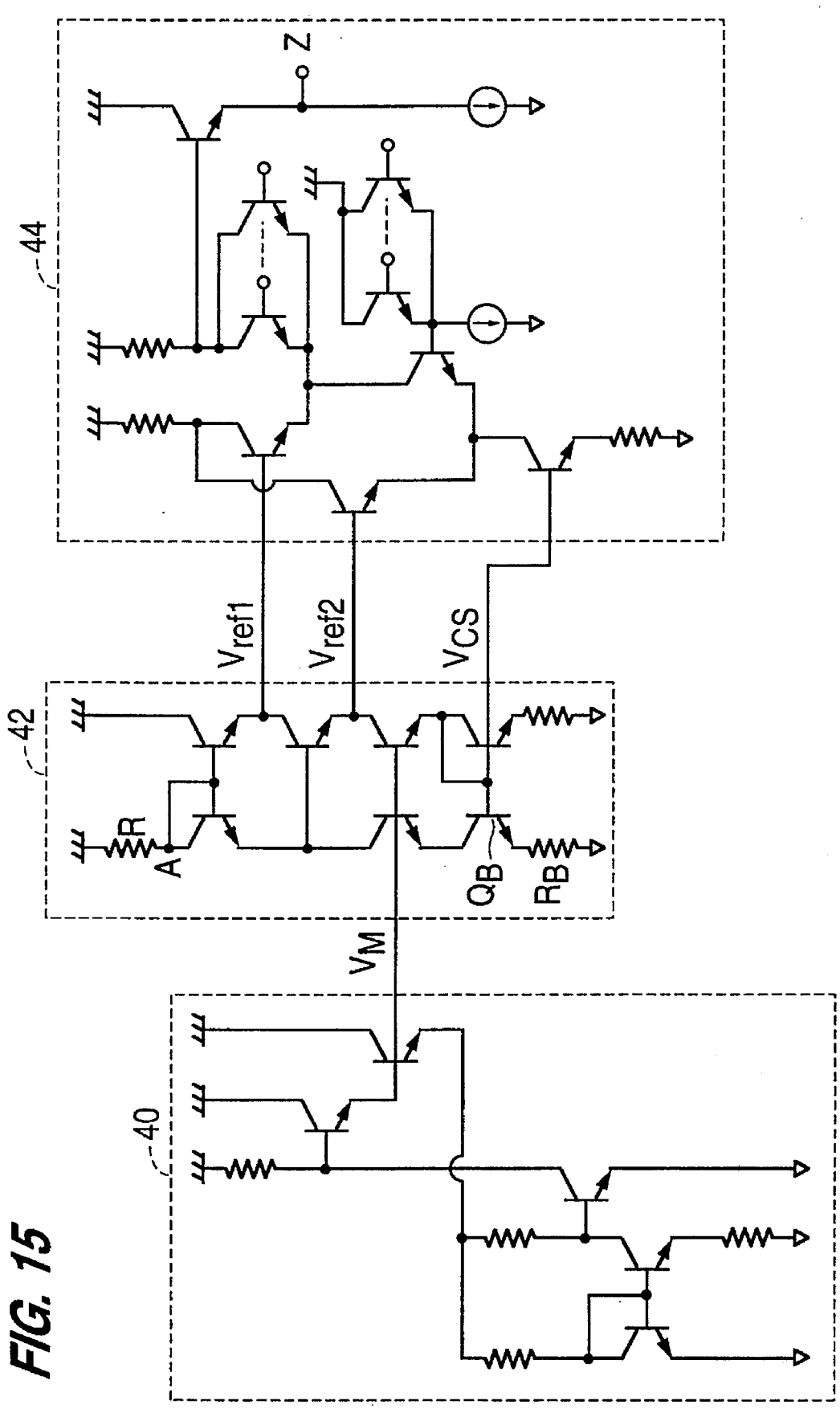
FIG. 15 is a circuit diagram showing a practical example of the reference potential generating circuit.

In the above-mentioned reference potential generating circuits as shown in FIGS. 14A and 14B, the reference potential is usually generated on the basis of a constant potential obtained by a band gap reference circuit, as shown in FIG. 15. In FIG. 15, a constant potential $V_M$ generated by a master bias circuit 40 based upon a Widlar's band gap reference circuit (referred to as BGR circuit, hereinafter) is transmitted to a slave bias circuit 42. On the basis of this constant potential $V_M$, the slave bias circuit 42 generates three reference potentials $V_{ref1}$, $V_{ref2}$ and $V_{ref3}$. The generated three reference potentials $V_{ref1}$, $V_{ref2}$ and $V_{ref3}$ are transmitted to an ECL circuit 44. The load resistor R of the slave bias circuit 42 corresponds to the resistor R of the circuit shown in FIG. 14A, and the reference potential $V_{CS}$, the transistor $Q_B$ and the load resistor $R_B$ of the slave bias circuit 42 correspond to the constant current source 4 of the circuit shown in FIG. 14A, respectively.

In a third aspect of the semiconductor device including a reference potential control circuit according to the present invention, the reference potential level $V_{ref}$ generated by the reference potential generating circuit is switched between the ordinary operation and the burn-in operation. A first embodiment of the third aspect of the semiconductor device including the reference potential control circuit according to the present invention will be described hereinbelow with reference to the attached drawings. The concept of the first embodiment is describe with reference to FIGS. 1A and 1B, in which the reference potential $V_{ref}$ is directly controlled by applying an input voltage $V_{IN}$ from the outside to a pad 2 connected to one end of the load resistor R of each of the reference potential generating circuits shown in FIGS. 14A and 14B, respectively.

In the ordinary operation, the input voltage $V_{IN}$ is set to the ground level by connecting the pad 2 to a terminal pin to which a signal of ground level is input. In the burn-in operation, however, the input voltage $V_{IN}$ is set to $V_{ref}$ (H)–$V_{IM}$ or $V_{ref}$(L)–$V_{IM}$. Then, the reference potential $V_{ref}$ in the ordinary operation is $$V_{ref} = V_{IM}$$

and the reference potential $V_{ref}$ in the burn-in operation is $$V_{ref} = V_{IN} + V_{IM} = V_{ref} (H)$$

or $$V_{ref} = V_{IN} + V_{IM} = V_{ref} (L)$$

Figure 1B:
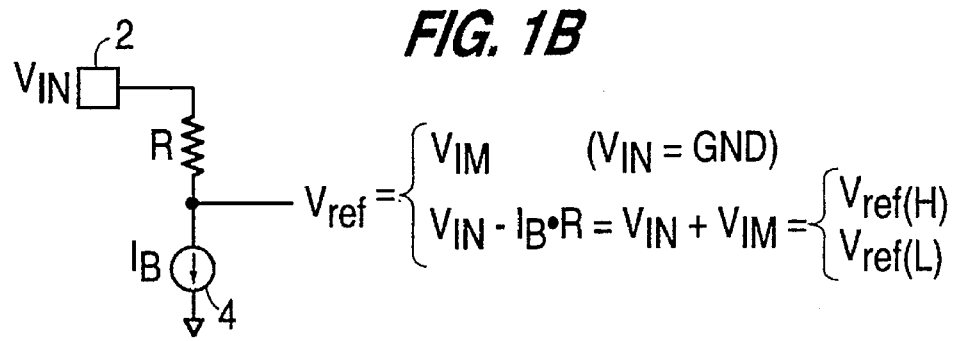

Here, when the resistance of the load resistor is denoted by R; the constant current of the constant current source 4 is denoted by $I_B$; and $V_{BE}$ of the transistor Q1 is denoted by Φ, the $V_{IM}$ is $$V_{IM} = -(I_B \cdot R + \Phi)$$

in the burn-in device shown in FIG. 1A and $$V_{IM} = -I_B \cdot R$$

in the burn-in device shown in FIG. 1B.

Here, the $V_{ref}$ (H) or the $V_{ref}$ (L) denotes a desired "H" level or a desired "L" level of the reference potential $V_{ref}$.

Figure 2:
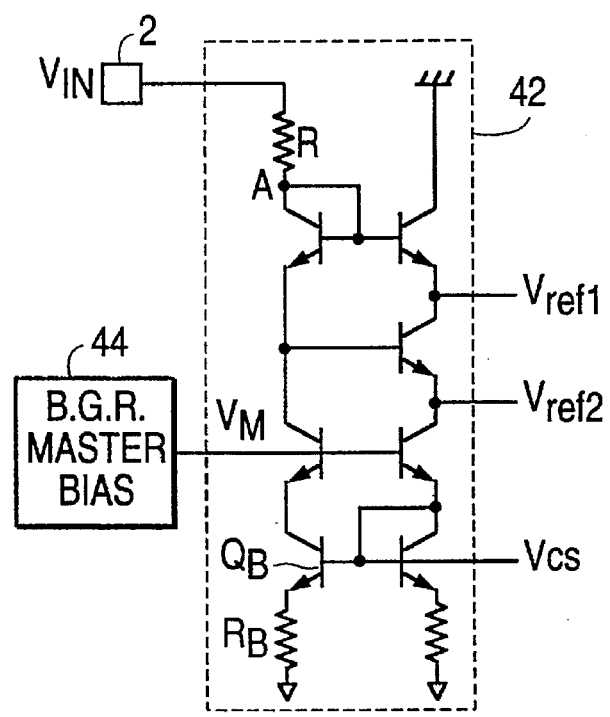
FIG. 2 is a circuit diagram showing a practical reference potential generating circuit to which the concept shown in FIGS. 1A and 1B is applied.

FIG. 2 shows a circuit configuration, in which the concept shown in FIGS. 1A and 1B are applied to the practical reference potential generating circuit shown in FIG. 15. In FIG. 2, one end of the load resistor of the slave bias circuit 42 is connected to a pad 2.

As described above, it is possible to switch the reference potential $V_{ref}$ between the ordinary operation and the burn-in operation by connecting one end of the load resistor of the reference potential generating circuit to the pad 2 and further by applying an appropriate input voltage $V_{IN}$ from the outside. In addition, since any desired $V_{ref}$ (H) or $V_{ref}$ (L) can be applied to the ECL circuit in the burn-in operation, it is possible to reduce the time required for the burn-in operation markedly.

Figure 3A:
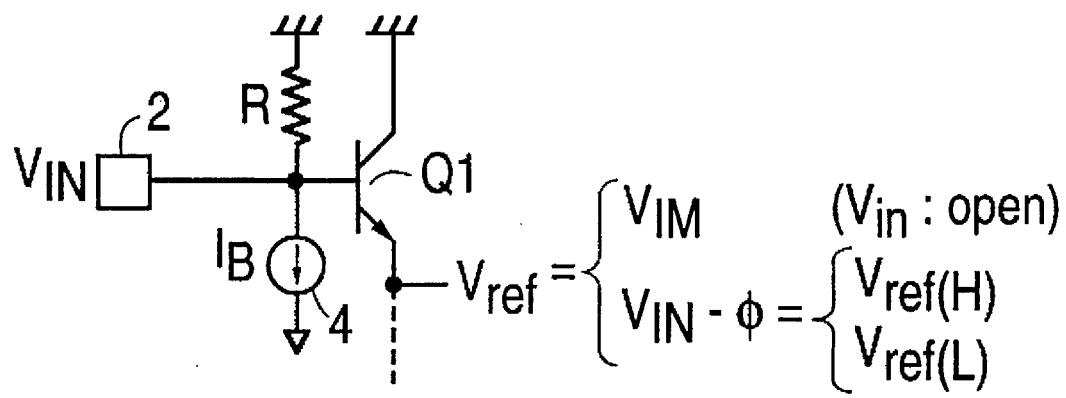
FIGS. 3A and 3B are circuit diagrams for assistance in explaining a modification of the first embodiment of the third aspect of the present invention.
Figure 3B:
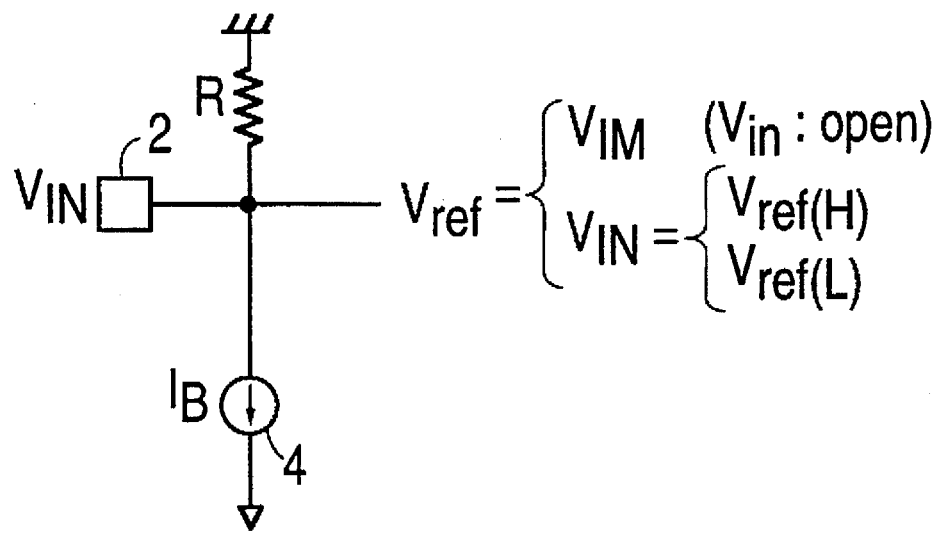

Further, a modification of the first embodiment is shown in FIGS. 3A and 3B, respectively. In this modification, the pad 2 is connected to a junction point between the load resistor R and the constant current source 4, and this pad 2 is opened in the ordinary operation. Further, in the burn-in operation, the input voltage $V_{IN}$ is set to $V_{ref}$(H)+Φ or $V_{ref}$(L)+Φ in the case of the device shown in FIG. 3A and to $V_{ref}$(H) or $V_{ref}$(L) in the case of the device shown in FIG. 3B.

In the above-mentioned modification, it is possible to obtain the same effect as with the case of the first embodiment. Further according to the modifications as shown in FIGS. 3A and 3B, since the pad 2 is opened in the ordinary operation, there in no need for connection of the pad 2 after sealing the ECL circuit into a package, so that it is possible to decrease the number of terminal pins provided to package and also production costs.

Further, when the above-mentioned modification is applied to the practical circuit, the node A of the circuit shown in FIG. 15 is connected to the pad 2.

Figure 4A:
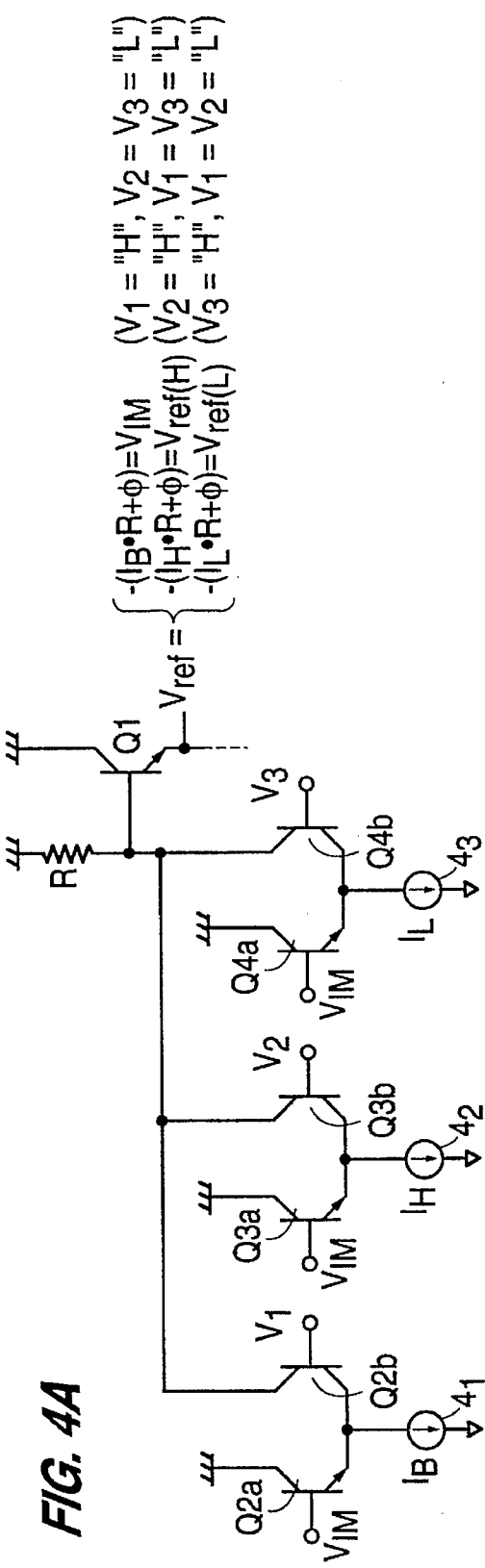
FIGS. 4A and 4B are circuit diagrams for assistance in explaining a concept of a second embodiment of the third aspect of the present invention.
Figure 4B:
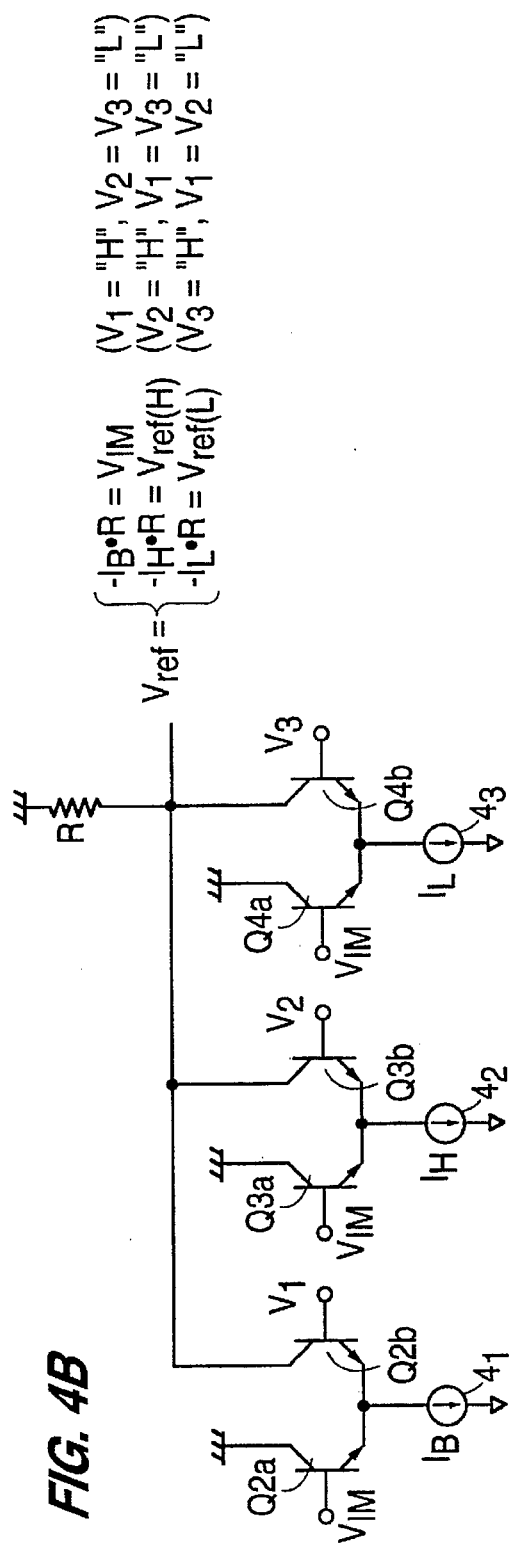

A second embodiment of the third aspect of the semiconductor device including a reference potential control circuit according to the present invention will be described hereinbelow with reference to FIGS. 4A and 4B and FIG. 5. The concept of the second embodiment is shown in FIGS. 4A and 4B, in which the intensity of the current $I_B$ of the constant current source 4 of each of the reference potential generating circuits shown in FIGS. 14A and 14B is switched. Here, the current intensity is switched in combination of three pairs of npn bipolar transistors ($Q2_a$, $Q2_b$), ($Q3_a$, $Q3_b$) and ($Q4_a$, $Q4_b$) and three constant current sources $4_1$, $4_2$ and $4_3$. In FIG. 4A and 4B, two emmitters of the two transistors $Q2_a$ and $Q2_b$ are connected in common to the constant current source $4_1$; two emitters of the two transistors $Q3_a$ and $Q3_b$ are connected in common to the constant current source $4_2$; and two emitters of the two transistors $Q4_a$ and $Q4_b$ are connected in common to the constant current source $4_3$, respectively. Further, collectors of the transistors $Q2_a$, $Q3_a$ and $Q4_a$ are grounded in common, and collectors of the transistors $Q2_b$, $Q3_b$ and $Q4_b$ are connected in common to one end of a load resistor R. On the other hand, the other end of the load resistor R is grounded. Further, an intermediate constant level potential $V_{IM}$ between "H" level and "L" level is applied to bases of the transistors $Q2_a$, $Q3_a$ and $Q4_a$, and potentials $V_1$, $V_2$ and $V_3$ are applied to bases of the transistors $Q2_b$, $Q3_b$ and $Q4_b$, respectively. When one of the three potentials $V_1$, $V_2$ and $V_3$ is set to the "H" level and the remaining potentials are set to the "L" level, only the transistor having the base to which the "H" level potential is applied is turned on, so that current of the constant current source connected to the turned-on transistor flows through the load resistor R. For instance, when $V_1$ is set to the "H" level and $V_2$ and $V_3$ are set to the "L" level, only the transistor $Q2_b$ of the transistors $Q2_b$, $Q3_b$ and $Q4_b$ is turned on, so that the constant current $I_B$ of the constant current source $4_1$ flows through the load resistor R. Therefore, when the constant currents $I_B$, $I_H$ and $I_L$ of the constant current sources $4_1$, $4_2$ and $4_3$ are set to different appropriate values, respectively, it is possible to set the level of the reference potential $V_{ref}$ to any desire levels to $V_{IM}$, $V_{ref}$ (H) and $V_{ref}$ (L), respectively without changing the levels of the potentials $V_1$, $V_2$ and $V_3$.

Figure 5:
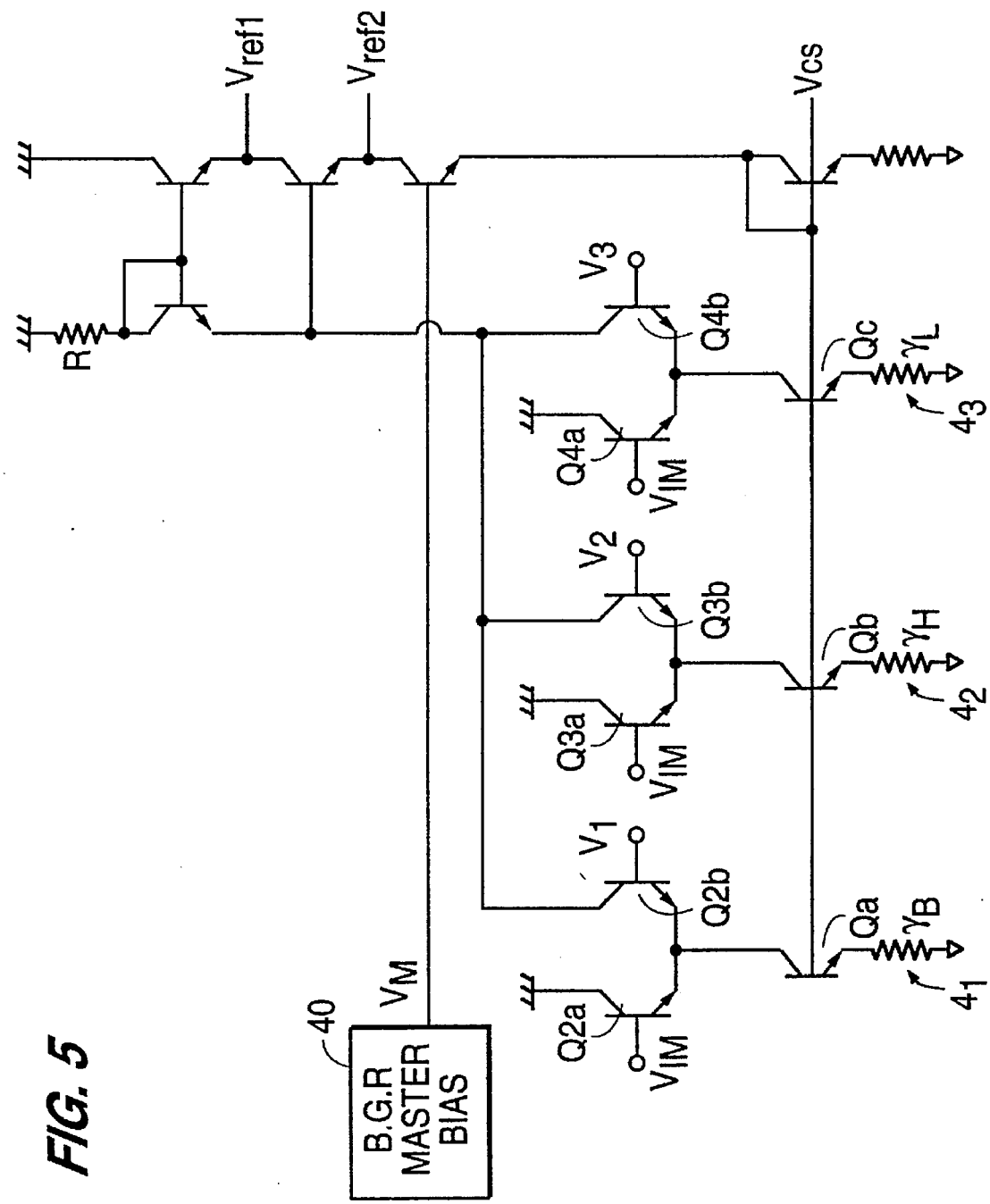
FIG. 5 is a circuit diagram showing a practical reference potential generating circuit to which the concept shown in FIGS. 4A and 4B is applied.

FIG. 5 shows a practical reference potential control circuit, in which the concept shown in FIG. 4A is applied to the circuit shown in FIG. 15. In this circuit, each of the three constant current sources is a series circuit of a resistor and an npn transistor. For instance, the constant current source $4_1$ is composed of a transistor $Q_a$ and a resistor $\gamma_B$; the constant current $4_2$ is composed of a transistor $Q_b$ and a resistor $\gamma_H$; and the constant current source $4_3$ is composed of a transistor $Q_c$ and a resistor $\gamma_L$, respectively. Here, the current levels of the three constant current sources $4_1$, $4_2$ and $4_3$ can be adjusted by adjusting the resistance values $\gamma_B$, $\gamma_H$ and $\gamma_L$ (further, the sizes of the transistors $Q_a$, $Q_b$ and $Q_c$ are adjusted, where necessary).

As described above, it is possible to obtain the same effect as with the case of the first embodiment.

Further a modification of the second embodiment is shown in FIGS. 6A and 6B. In this modification, three pairs of the npn bipolar transistors ($Q2_a$, $Q2_b$), ($Q3_a$, $Q3_b$) and ($Q4_a$, $Q4_b$) of the reference potential control circuit of the semiconductor device shown in FIG. 4A and 4B are replaced with three switches of three P-type MOS transistors $T_1$, $T_2$ and $T_3$. By switching the potentials $V_1$, $V_2$ and $V_3$ applied to the respective gates of the three MOS transistors $T_1$, $T_2$ and $T_3$, it is possible to obtain the same effect as the second embodiment. Further, in the above-mentioned modification, although the P-type MOS transistors are used, it is of course possible to uses N-type MOS transistors of analog switches in which P-type and N-type MOS transistors are connected in parallel to each other. Further, the MOS transistor switches can be connected to any branched current paths. For instance, the MOS transistor can be connected between the bipolar transistor of the constant current source and the resistor or between the resistor and a supply voltage $V_{EE}$.

Figure 7A:
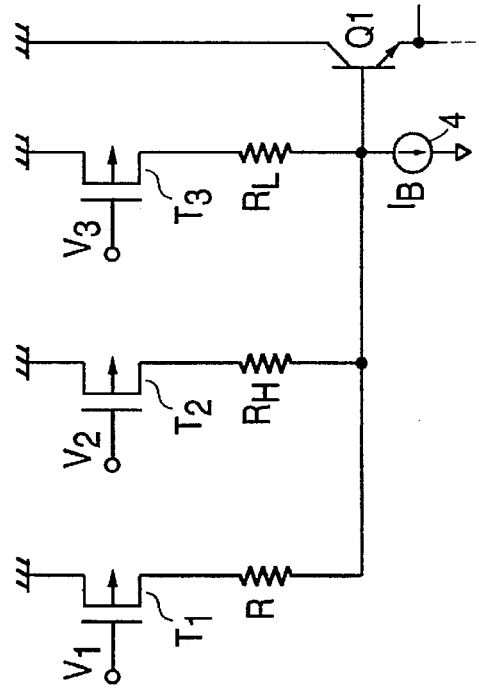
FIGS. 7A and 7B are circuit diagrams for assistance in explaining a concept of a third embodiment of the third aspect of the present invention.
Figure 7B:
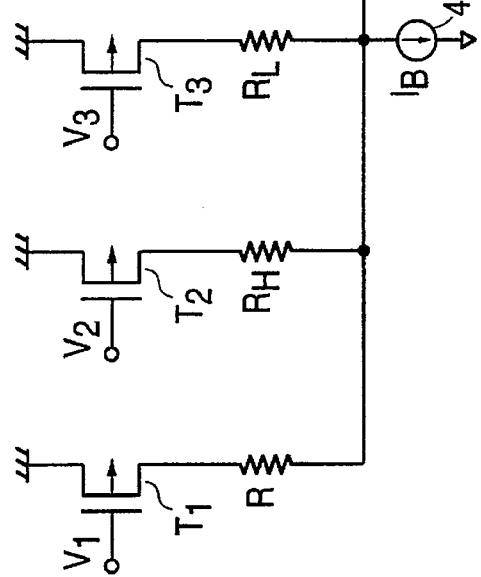

A third embodiment of the third aspect of the semiconductor device including a reference potential control circuit according to the present invention will be described hereinbelow with reference to FIGS. 7A and 7B and FIG. 8. The concept of the third embodiment is shown in FIGS. 7A and 7B, in which the intensity of the load resistance R of each of the reference potential generating circuits shown in FIGS. 14A and 14B is switched. Here, three P-type MOS transistors $T_1$, $T_2$ and $T_3$ are used as the switches. A series connected transistor $T_1$ and a load resistor R, a series-connected transistor $T_2$ and a load resistor $R_H$, and a series-connected transistor $T_3$ and a load resistor $R_L$ are connected in parallel to each other, and further connected in common to a constant current source 4. Current can be passed through only one of the above-mentioned three series-connected circuits, by adjusting potentials $V_1$, $V_2$ and $V_3$ applied to gates of the transistors $T_1$, $T_2$ and $T_3$, respectively and appropriately. For instance, when $V_1$ is set to $V_{EE}$ and $V_2$ and $V_3$ are set to the GND level, only the transistor $T_1$ is turned on, so that current flows through the series-connected circuit composed of the transistor $T_1$ and the resistor R. Accordingly, it is possible to switch the reference potential $V_{ref}$ to any desired levels of $V_{IM}$, $V_{ref}(H)$ and $V_{ref}(L)$ respectively, by setting and values of the three resistors R, $R_H$ and $R_L$ appropriately.

Figure 8:
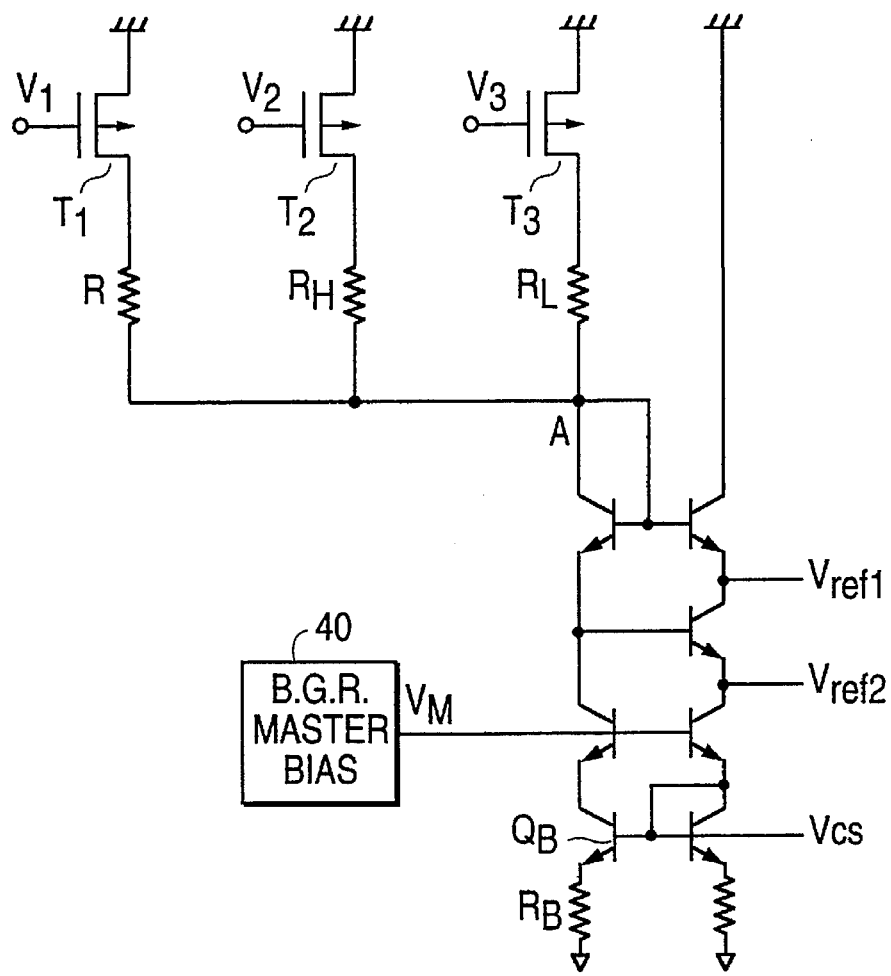
FIG. 8 is a circuit diagram showing a practical reference potential generating circuit to which the concept shown in FIGS. 7A and 7B is applied.

FIG. 8 shows a practical reference potential control circuit, in which the concept shown in FIG. 7A is applied to the circuit shown in FIG. 15. In this circuit, in the same way as with the case of the device shown in FIG. 7A, it is possible to switch the potential at the node A by setting the potentials applied to the gate of the transistors or switches $T_1$, $T_2$ and $T_3$ appropriately, so that it is possible to switch the reference potentials $V_{ref1}$ and $V_{ref2}$ to any desired level.

In the case of the third embodiment, it is possible to obtained the same effect as the first embodiment.

Further, in the above-mentioned third embodiment, although the P-type MOS transistors are used as the switches, it is of course possible to use N-type MOS transistors or analog switches in which P-type and N-type MOS transistors are connected in parallel to each other. Further, these switches can be connected to any current paths. For instance, the switch can be connected between the resistance and the node A.

One embodiment of a fourth aspect of the semiconductor device including a circuit, such as an ECL circuit, and a reference potential control circuit which conducts the burn-in operation according to the present invention will be described hereinbelow with reference to FIG. 9. In this embodiment, the semiconductor device comprises shorting means for shorting the complementary output nodes of the differential switch stage of the gates of the ECL circuit in the burn-in operation, and switching means for switching the reference potential of the ECL circuit between the ordinary operation and the burn-in operation.

Figure 9:
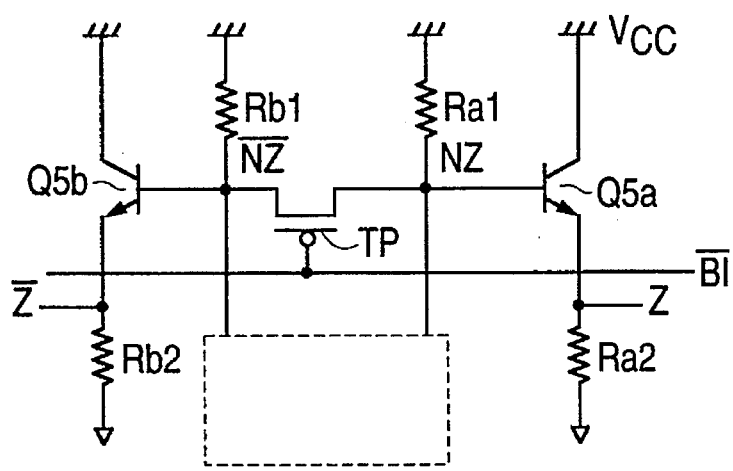
FIG. 9 is a circuit diagram showing a practical example of shorting means of a fourth aspect of the present invention.

FIG. 9 shows an example of the shorting means. In FIG. 9, a source and a drain of a P-type MOS transistor $T_p$ are connected between two complementary output nodes NZ and /NZ to be shorted, and a gate thereof is connected to a control line /BI. In the burn-in operation, the control line /BI is set to the "L" level to turn on the P-type MOS transistor $T_p$, and in the ordinary operation, the control line /BI is set to the "H" level to turn off the P-type MOS transistor $T_p$. By use of this method, it is possible to short the complementary output nodes only in the burn-in operation.

Further, the complementary output nodes can be shortened in the burn-in operation as follows: the complementary output nodes are previously shorted by use of a metal wire. After the burn-in operation, the metal wiring is cut off by use of a laser or removed away by a chemical process, and thereafter the metal wiring is reformed so as not to short the complementary output nodes.

Further, the switching means for switching the reference potential between the burn-in operation and the ordinary operation can be constructed in the same way as with the case of the embodiments of the third aspect of the present invention.

In this fourth aspect of the present invention, it is possible to pass current through all the current paths of the ECL circuit without using any test patterns, by first shorting the complementary output nodes of the differential switch stage of all the gates of the ECL circuit by use of the shorting means and thereafter by switching the reference potential of the ECL circuit to any desired levels by use of the switching means. Therefore, it is possible to shorten the time required for the burn-in operation markedly, eliminate the test patterns, enable the burn-in operation to some extent on the wafer, and eliminate the use of the expensive pulse generators for inputting the test patterns.

Figure 24:
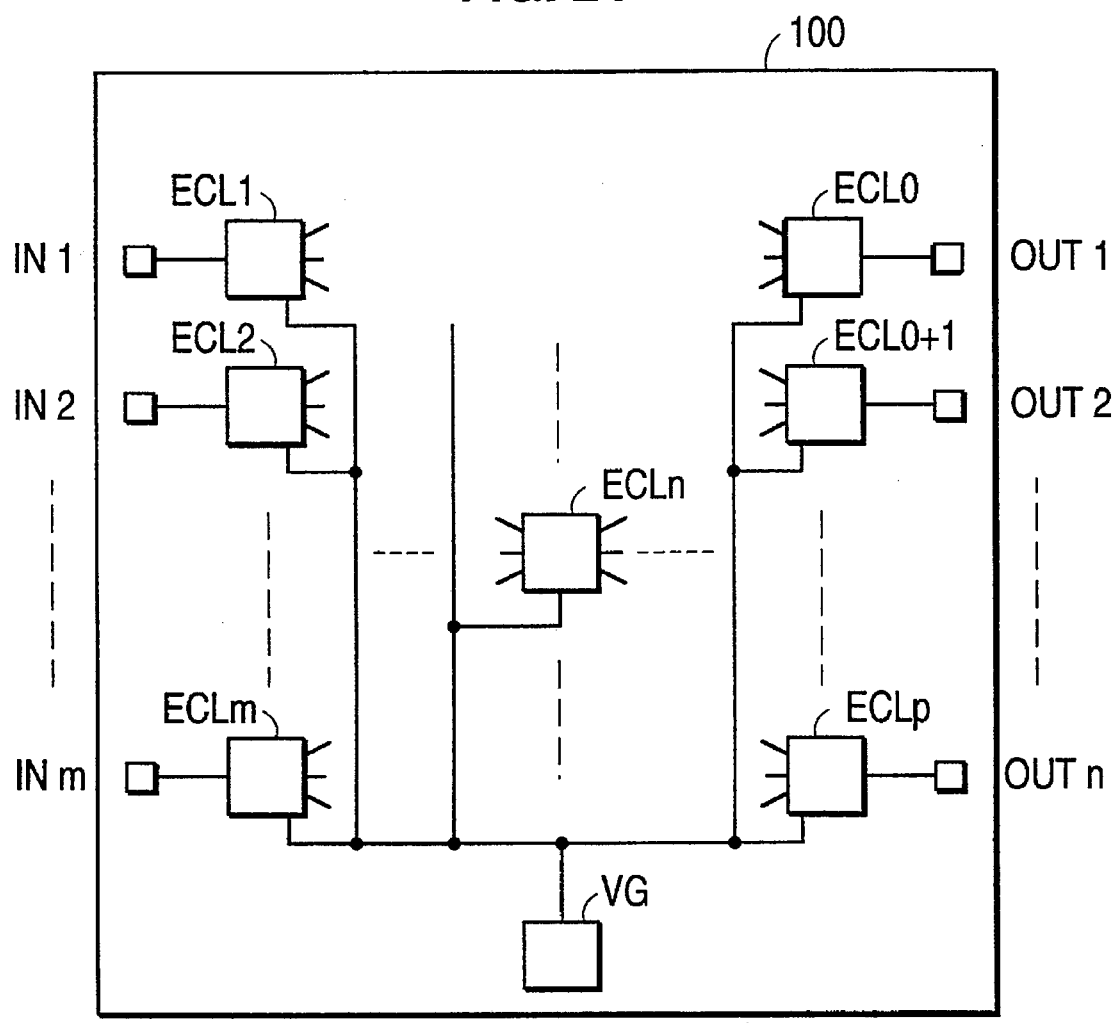
FIG. 24 is a block diagram showing an example of the arrangement in which a large number of ECL circuits are arranged on a semiconductor substrate.

FIG. 24 shows a circuit configuration in which a large number of ECL circuits shown in FIG. 16 or FIG. 18 are arranged on a semiconductor substrate 100. A reference potential generation circuit VG supplies each of the ECL circuits with one or three reference potentials ($V_{ref1}$, $V_{ref2}$ and $V_{ref3}$). Accordingly, it is possible to simultaneously conduct the burn-in operation to all the ECL circuits on the semiconductor substrate 100 by controlling the reference potential(s) generated by the potential generation circuit VG as described in the above respective embodiments.

The embodiments have been described in such a way that the present invention is applied to ECL circuits. Further, the present invention can be applied to a circuit including semiconductor devices, such as MOSFET, which functions like the ECL circuit.

As described above, it is possible to shorten the time for required for the burn-in operation markedly.

Especially, in the case where a large number of ECL circuits are arranged on a semiconductor substrate, extensive and bulky test patterns must be inputted tho those ECL circuits via a large number of input terminals in the conventional method. Further, in the conventional method, there are ECL circuits through which currents rarely flow when ELC circuits are complicatedly connected together, there exists a problem in that the test time required for the burn-in operation is too long.

Contrary to this, it is possible to conduct the burn-in operation only by controlling reference potentials supplied to ECL circuits according to the present invention. Therefore, test patterns of a small number of steps are available and the burn-in operation can be conducted to a large number of ECL circuits, so that the time for required for the burn-in operation can be shortened markedly.

Further, since test patterns of a small number of steps are available, it is possible to conduct the burn-in operation in a stage of tests where ECL circuits are arranged on a wafer before packaged. Therefore, expensive packages will not be wasted and further burn-in boards and expensive pulse generator are not required for the operation.

What is claimed is:

1. A semiconductor device, comprising: compare means for comparing an input signal potential having a level that is less than a maximum level and greater than a minimum level with a reference potential which is set to an intermediate level between the maximum level and the minimum level to output an output signal according to the comparison result in an ordinary operation, and switching means for switching the reference potential level from the intermediate level set during the ordinary operation to a level higher than the maximum level and then to another level lower than the minimum level during a burn-in operation.

2. A semiconductor device according to claim 1, wherein the different level set during the burn-in operation for the reference potential level is one of a level greater than the maximum level of the input signal potential and a level less than the minimum level of the input signal potential.

3. A semiconductor device according to claim 1, wherein the reference potential level set during the burn-in operation is a plurality of reference potentials, including at least a first reference potential that is set to a level greater than the maximum level of the input signal potential, and a second reference potential that is set to a level less than the minimum level of the input signal potential.

4. A semiconductor device, comprising:

comparing means for comparing an input signal potential having a level that is less than a maximum level and greater than a minimum level with a reference potential which is set to a first intermediate level between the maximum level and the minimum level, and for outputting an output signal according to the comparison result in an ordinary operation, setting means for setting the input signal potential during a burn-in operation to a second intermediate level half-way between the maximum level and the minimum level of the input signal potential, and switching means for switching the reference potential level from the first intermediate level set during the ordinary operation to a level higher than the second intermediate level and then to another level lower than the second intermediate level during the burn-in operation.

5. The semiconductor device according to claim 4, wherein the device further comprises a plurality of signal output circuits connected together, each of which has a differential circuit, the signal output circuit comparing an input signal applied to the differential circuit with the reference potential to output an output signal according to the comparison result and the setting means sets the input signal potential, to be applied to a post-stage signal output circuit, to the second intermediate level by shorting complementary output nodes of the differential circuit.

6. A semiconductor device according to claim 4, wherein said device is an emitter-coupled logic (ECL) circuit which includes a differential switch stage having complementary output nodes, said device further comprising shorting means for shorting the complementary output nodes during the burn-in operation only.

7. A semiconductor device, comprising:

compare means for comparing, as a first comparison result, a first input signal potential having a first level that is less than a first maximum level and greater than a first minimum level with a first reference potential which is set to a first intermediate level between the first maximum level and the first minimum level to output a first output signal according to the first comparison result in an ordinary operation, and for comparing, as a second comparison result, a second input signal potential having a second level that is less than a second maximum level and greater than a second minimum level with a second reference potential which is set to a second intermediate level between the second maximum level and the second minimum level to output a second output signal according to the second comparison result in the ordinary operation; and switching means for switching the first reference potential level from the first intermediate level set during the ordinary operation to a level higher than the first maximum level and then to another level lower than the first minimum level during a burn-in operation, and for switching the second reference potential level from the second intermediate level set during the ordinary operation to still another level higher than the second maximum level and then to a still further level lower than the second minimum level during the burn-in operation.

* * * * *